United States Patent
Quinn et al.

(10) Patent No.: US 9,093,259 B1
(45) Date of Patent: Jul. 28, 2015

(54) COLLABORATIVE MUSICAL INTERACTION AMONG AVATARS

(75) Inventors: Robert Quinn, Sherman Oaks, CA (US); Matt Lisuch, Long Beach, CA (US)

(73) Assignee: Disney Enterprises, Inc., Burbank, CA (US)

( * ) Notice: Subject to any disclaimer, the term of this patent is extended or adjusted under 35 U.S.C. 154(b) by 322 days.

(21) Appl. No.: 13/297,999

(22) Filed: Nov. 16, 2011

(51) Int. Cl.
*G06F 3/048* (2013.01)
*H01L 29/00* (2006.01)

(52) U.S. Cl.
CPC ..................................... *H01L 29/00* (2013.01)

(58) Field of Classification Search
CPC ............... G10H 1/368; G10H 1/0025; G10H 2210/091; G10H 2220/145
USPC .............................................. 715/706; 463/7
See application file for complete search history.

(56) References Cited

U.S. PATENT DOCUMENTS

| | | | |
|---|---|---|---|
| 7,958,453 B1 * | 6/2011 | Taing | 715/744 |
| 2008/0181140 A1 * | 7/2008 | Bangor et al. | 370/261 |
| 2009/0240359 A1 * | 9/2009 | Hyndman et al. | 700/94 |
| 2009/0300513 A1 * | 12/2009 | Nims et al. | 715/747 |
| 2010/0319517 A1 * | 12/2010 | Savo et al. | 84/609 |

FOREIGN PATENT DOCUMENTS

WO   WO 2010042449 A2 *   4/2010

* cited by examiner

*Primary Examiner* — Amy Ng
*Assistant Examiner* — Di Xiao
(74) *Attorney, Agent, or Firm* — Pillsbury Winthrop Shaw Pittman LLP

(57) ABSTRACT

Collaborative musical performance and/or composition may be facilitated in virtual spaces. A song selection and/or a first instrument selection associated with a first avatar may be received. A representation may be provided in the virtual space of the first avatar playing a first track of the song using the first instrument, which may correspond to a component of the song associated with the first instrument. A second avatar may be prompted to select a second instrument responsive to the second avatar being positioned within an interaction region associated with the first avatar. A representation may be provided in the virtual space of the first avatar playing a first track of the first song using the first instrument and the second avatar playing a second track of the first song using the second instrument. The second track may correspond to a component of the first song associated with the second instrument.

33 Claims, 2 Drawing Sheets

COLLABORATIVE MUSICAL INTERACTION AMONG AVATARS

FIELD OF THE DISCLOSURE

This disclosure relates to facilitating collaborative musical performance and/or composition among avatars in a virtual space.

BACKGROUND

In existing virtual spaces, musical interactions among avatars are typically based around rhythm games. Such rhythm games, however, do not allow a group of avatars to come together in a virtual space and participate in performing and/or composing music in a collaborative, non-gaming, more-social sense, as real-world friends might when gathering for a jam session.

SUMMARY

One aspect of the disclosure relates to a system configured to facilitate collaborative musical performance and/or composition in a virtual space, in accordance with one or more implementations. In exemplary implementations, users (via their avatars) may obtain different virtual musical instruments and play various songs using those instruments. Once an avatar is playing a song, other avatars may join in using instruments of their own. Avatars may play a selected song, play solos over a selected song, and/or play original music. A given avatar's ability to play an instrument and/or song may be independent from musical talents (or lack thereof) of a user associated with that avatar. In some implementations, system may include a server. The server may be configured to communicate with one or more client computing platforms. The users may access system and/or the virtual space via client computing platforms.

The server may be configured to execute one or more computer program modules. The computer program modules may include one or more of a user module, a space module, a relationship module, an inventory module, a song management module, an instrument management module, an interaction module, a song ownership module, a soloing module, a stereo panning module, and/or other modules.

The user module may be configured to access and/or manage one or more user profiles and/or user information associated with users of the system. The one or more user profiles and/or user information may include information stored by server, one or more of the client computing platforms, and/or other storage locations.

The space module may be configured to implement the instance of the virtual space executed by the computer modules to determine views of the virtual space. The views may then be communicated (e.g., via streaming, via object/position data, and/or other information) from server to client computing platforms for presentation to users.

The relationship module may be configured to establish relationships between users within the virtual space. Such relationships may include one or more of music bands (with band-mates), friendships, guilds (with guild-mates), alliances, connections, followers, and/or other relationships. Relationships may include one or more types of relationships that have a functional purpose or impact within the virtual space, and/or one or more types of relationships that a social construct within the virtual space that does not have a functional result.

The inventory module may be configured to manage inventories associated with the users. These may include inventories associated with user characters controlled by the users, inventories associated with accounts of the users, and/or other inventories associated with the users. An inventory may be associated with a single user and/or a group of two or more users. The inventories may include virtual objects and/or items usable in the virtual space. The virtual objects may include one or more of a musical instrument, an object usable to create sounds, a musical accessory, and/or other objects. An inventory associated with a user character may include the total inventory the user character controls, and/or a subset of the total inventory which may be immediately available to the user character (e.g., currently being carried by the user character).

The inventory module may be configured to access and/or manage virtual good inventories. This may include tracking virtual goods associated with users of the virtual space. The virtual goods may include non-physical objects that are expressible within the virtual space. The virtual goods associated with an individual user may include one or more of a song, a portion of a song, a track of a song corresponding to a specific instrument, an individual sound, a collection of sounds, and/or other virtual goods.

The song management module may be configured to receive song selections. A song selection may indicate a song from a song inventory associated with an avatar. Such a song inventory may be managed by inventory module. A song selection may be received responsive to a request, invitation, and/or other prompt to select a song. According to some implementations, the song management module may be configured to receive a song selection that corresponds to a song file uploaded by a user, a song file stored locally by a user (e.g., a song file stored by a client computing platform), a song file stored remotely from a client computing platform and accessible by a user via the client computing platform, and/or other song files accessible within the system.

The instrument management module may be configured to receive instrument selections. An instrument selection may indicate an instrument from an instrument inventory associated with an avatar. Such an instrument inventory may be managed by inventory module. An instrument selection may be received responsive to a request, invitation, and/or other prompt to select a song.

In some implementations, space module may be configured to provide a representation in the virtual space of an avatar playing a track of a selected song using a selected instrument. The track being played by the avatar may correspond to a component of the selected song associated with the selected instrument. For example, where the selected instrument is a guitar, the track may be the guitar part of the selected song. The representation may include a visual presentation and/or an audio signal. The visual presentation may depict the avatar playing the selected song using the selected instrument. The audio signal may include information associated with the track of the selected song being played by the avatar.

The interaction module may be configured to manage one or more interactions between avatars in the virtual space. In some implementations, an interaction region may be associated a first avatar playing a song. When a second avatar breaches or is otherwise positioned within the interaction region of the first interaction, the second avatar may interact with the first avatar. Such an interaction may include hearing the first avatar playing a song, playing along with the first avatar, and/or other interactions. Managing an interaction between avatars may include providing a request, invitation, and/or other prompt to join a given avatar in playing a song.

Generally speaking, a prompt may be provided by a visual indication, an audible indication, and/or a textual indication. The interaction region associated with a given avatar may by an area or volume surrounding that avatar. According to some implementations, the interaction region of a given avatar may include an area shaped as a circle, square, oval, rectangle, and/or other shape that is approximately centered at the position of the avatar.

In some implementations, space module may be configured to provide a representation in the virtual space of a first avatar playing a first track of a selected song using a first instrument and a second avatar playing a first track of the selected song. The track being played by the first avatar may correspond to a component of the selected song associated with the first instrument, while the track being played by the second avatar may correspond to a component of the selected song associated with the second instrument. For example, where the first avatar selected a guitar and the second avatar selected drums, space module may provide a representation of the first avatar playing the guitar part of the selected song and the second avatar playing the drums part of the selected song. According to some implementations, the track played by the first and second avatars may be automatically synchronized. This may be extended to a plurality of avatars playing the selected song using their respective instruments. The total number of avatars and/or the total number of a specific instrument being played may be limited to some finite quantity to promote a desired musical experience.

The song ownership module may be configured to designate a song owner and/or one or more song participants with respect to a given song being played. A song owner may be an avatar that selected the song being played, while a song participant may be an avatar that joined in playing the song after the song owner had begun to play. The song owner may be designated responsive to a song selection being received by song management module. A song participant may be designated responsive to an avatar selecting an instrument in order to participate with the song owner.

The song owner of a song may be enabled to stop playback of the song. A song participant may be unable to stop playback of the song. The song may loop indefinitely until it is stopped by the song owner. According to some implementations, when a song owner stops playing a song, that song owner has released control of what song will be played next. At such a point, the original song owner and/or another avatar may select the next song. In instances where there are multiple song owners that encounter each other's interactive regions, the song owner that has been playing for the longest amount of time may seize control of the song being played so that both avatars are playing the same song.

The soloing module may be configured to receive input from a user associated with an avatar. The input may convey musical solo information. The first musical solo information may be added to an audio signal provided by space module. By way of non-limiting example, a guitar solo may be added to a song being played in conjunction with soloing module. In some implementations, musical solo information may be associated with one or more of a plurality of avatars playing a given song. Input may be provided by users via client computing platforms.

The stereo panning module may be configured to determine stereophonic information based on a rotation and a position of a given avatar relative to a position of one or more other avatars that are playing a song within the same interaction region. Such stereophonic information may be included in an audio signal provided by space module. For example, the volume of an audio signal provided to a user associated with a first avatar may increase as the first avatar approaches a second avatar playing a song. As another example, if the second avatar is playing on the right side of the first avatar, the right channel of the audio signal provided to the user associated with the first avatar may be louder than the left channel. Where there are many avatars playing proximate to the first avatar, the audio signal provided to the user associated with the first avatar may be mixed according to the orientation and position of the first avatar relative to the other avatars.

In some implementations, there may be a limit to the tracks that can be heard by a given user. In such implementations, the space module may be configured to execute a sorting logic to determine which tracks are heard by a given user when there are more avatars playing a given song than the allowable number of tracks that can be heard. The instruments available to the avatars may be classified according to the role they have in a song. Examples of instrument classifications may include one or more of rhythm instruments, percussion instruments, lead instruments, melody instruments, and/or other instrument classifications. While an avatar may select any instrument available to them, the maximum number of instruments per classification that can be heard by a given user may be predetermined and/or limited in order to provide a desired balance in the playback of a song. According to some implementations, the instrument(s) heard by a given user may include the instrument being played by the avatar associated with the given user and, if there are other avatars playing along, the instruments being played by those other avatars up to the predetermined maximum number of instruments. Avatars playing instruments close to the given avatar may be heard preferentially over avatars playing instruments further from the given avatar. When two collocated avatars are playing the same instrument, only one of them may be heard by users associated with other nearby avatars.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
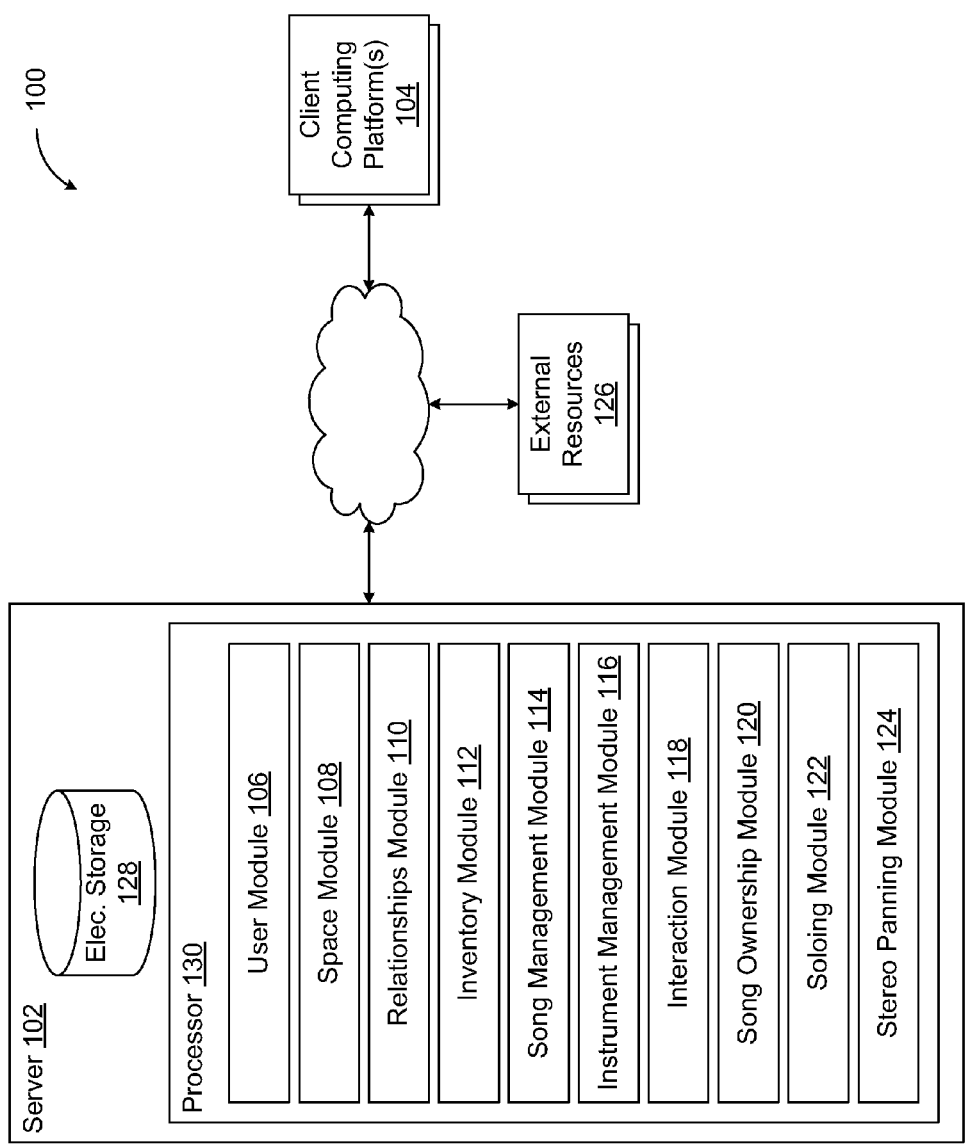
FIG. 1 illustrates a system configured to facilitate collaborative musical performance and/or composition in a virtual space, in accordance with one or more implementations.

FIG. 1 illustrates a system 100 configured to facilitate collaborative musical performance and/or composition in a virtual space, in accordance with one or more implementations. In exemplary implementations, users (via their avatars) may obtain different virtual musical instruments and play various songs using those instruments. Once an avatar is playing a song, other avatars may join in using instruments of their own. Avatars may play a selected song, play solos over a selected song, and/or play original music. A given avatar's ability to play an instrument and/or song may be independent from musical talents (or lack thereof) of a user associated with that avatar. In some implementations, system 100 may include a server 102. The server 102 may be configured to communicate with one or more client computing platforms 104 according to a client/server architecture. The users may access system 100 and/or the virtual space via client computing platforms 104.

The server 102 may be configured to execute one or more computer program modules. The computer program modules may include one or more of a user module 106, a space module 108, a relationship module 110, an inventory module 112, a song management module 114, an instrument management module 116, an interaction module 118, a song ownership module 120, a soloing module 122, a stereo panning module 124, and/or other modules.

The user module 106 may be configured to access and/or manage one or more user profiles and/or user information associated with users of the system 100. The one or more user profiles and/or user information may include information stored by server 102, one or more of the client computing platforms 104, and/or other storage locations. The user profiles may include, for example, information identifying users (e.g., a username or handle, a number, an identifier, and/or other identifying information) within the virtual space, security login information (e.g., a login code or password), virtual space account information, subscription information, virtual currency account information (e.g., related to currency held in credit for a user), relationship information (e.g., information related to relationships between users in the virtual space), virtual space usage information, demographic information associated with users, interaction history among users in the virtual space, information stated by users, purchase information of users, browsing history of users, a client computing platform identification associated with a user, a phone number associated with a user, and/or other information related to users.

The space module 108 may be configured to implement the instance of the virtual space executed by the computer modules to determine views of the virtual space. The views may then be communicated (e.g., via streaming, via object/position data, and/or other information) from server 102 to client computing platforms 104 for presentation to users. The view determined and transmitted to a given client computing platform 104 may correspond to a user character being controlled by a user via the given client computing platform 104. The view determined and transmitted to a given client computing platform 104 may correspond to a location in the virtual space (e.g., the location from which the view is taken, the location the view depicts, and/or other locations), a zoom ratio, a dimensionality of objects, a point-of-view, and/or view parameters. One or more of the view parameters may be selectable by the user.

The instance of the virtual space may comprise a simulated space that is accessible by users via clients (e.g., client computing platforms 104) that present the views of the virtual space to a user. The simulated space may have a topography, express ongoing real-time interaction by one or more users, and/or include one or more objects positioned within the topography that are capable of locomotion within the topography. In some instances, the topography may be a 2-dimensional topography. In other instances, the topography may be a 3-dimensional topography. The topography may include dimensions of the space, and/or surface features of a surface or objects that are "native" to the space. In some instances, the topography may describe a surface (e.g., a ground surface) that runs through at least a substantial portion of the space. In some instances, the topography may describe a volume with one or more bodies positioned therein (e.g., a simulation of gravity-deprived space with one or more celestial bodies positioned therein). The instance executed by the computer modules may be synchronous, asynchronous, and/or semi-synchronous.

The above description of the manner in which views of the virtual space are determined by space module 108 is not intended to be limiting. The space module 108 may be configured to express the virtual space in a more limited, or more rich, manner. For example, views determined for the virtual space may be selected from a limited set of graphics depicting an event in a given place within the virtual space. The views may include additional content (e.g., text, audio, pre-stored video content, and/or other content) that describes particulars of the current state of the place, beyond the relatively generic graphics. For example, a view may include a generic battle graphic with a textual description of the opponents to be confronted. Other expressions of individual places within the virtual space are contemplated.

Within the instance(s) of the virtual space executed by space module 108, users may control characters, objects, simulated physical phenomena (e.g., wind, rain, earthquakes, and/or other phenomena), and/or other elements within the virtual space to interact with the virtual space and/or each other. The user characters may include avatars. As used herein, the term "user character" may refer to an object (or group of objects) present in the virtual space that represents an individual user. The user character may be controlled by the user with which it is associated. The user controlled element(s) may move through and interact with the virtual space (e.g., non-user characters in the virtual space, other objects in the virtual space). The user controlled elements controlled by and/or associated with a given user may be created and/or customized by the given user. The user may have an "inventory" of virtual goods and/or currency that the user can use (e.g., by manipulation of a user character or other user controlled element, and/or other items) within the virtual space.

The users may participate in the instance of the virtual space by controlling one or more of the available user controlled elements in the virtual space. Control may be exercised through control inputs and/or commands input by the users through client computing platforms 104. The users may interact with each other through communications exchanged within the virtual space. Such communications may include one or more of textual chat, instant messages, private messages, voice communications, and/or other communications. Communications may be received and entered by the users via their respective client computing platforms 104. Communications may be routed to and from the appropriate users through server 102 (e.g., through space module 108).

The relationship module 110 may be configured to establish relationships between users within the virtual space. Such relationships may include one or more of music bands (with band-mates), friendships, guilds (with guild-mates), alliances, connections, followers, and/or other relationships. The relationship module 110 may establish relationships based on relationship requests and acceptances received from users. Establishment of a relationship may be initiated by a single communication (e.g., a request) initiated by a given user requesting a relationship between the given user and one or more other users. Establishment of a relationship may require a first communication from the given user to be approved by the one or more other users. Relationships may include one or more types of relationships that have a functional purpose or impact within the virtual space, and/or one or more types of relationships that a social construct within the virtual space that does not have a functional result.

The inventory module 112 may be configured to manage inventories associated with the users. These may include inventories associated with user characters controlled by the users, inventories associated with accounts of the users, and/or other inventories associated with the users. An inventory may be associated with a single user and/or a group of two or more users. The inventories may include virtual objects and/or items usable in the virtual space. The virtual objects may be wearable, bearable, storable, tradable, sellable, transferable, destroyable, usable, and/or disposable. The virtual objects may include one or more of a musical instrument, an object usable to create sounds, a musical accessory, and/or other objects. An inventory associated with a user character may include the total inventory the user character controls, and/or a subset of the total inventory which may be immediately available to the user character (e.g., currently being carried by the user character).

The inventory module 112 may be configured to access and/or manage virtual good inventories. This may include tracking virtual goods associated with users of the virtual space. Such virtual goods may or may not be visible in a virtual environment, in various implementations. This visibility and/or invisibility may be configurable by the user associated with the virtual goods. The virtual goods may include non-physical objects that are expressible within the virtual space. The virtual goods associated with an individual user may include one or more of a song, a portion of a song, a track of a song corresponding to a specific instrument, an individual sound, a collection of sounds, and/or other virtual goods. The virtual goods associated with an individual user may include one or more of virtual goods the user is currently using, virtual goods the user is currently carrying, virtual goods the user has access to, and/or other virtual goods associated with the user.

The song management module 114 may be configured to receive song selections. A song selection may indicate a song from a song inventory associated with an avatar. Such a song inventory may be managed by inventory module 112. A song selection may be received responsive to a request, invitation, and/or other prompt to select a song. According to some implementations, song management module 114 may be configured to receive a song selection that corresponds to a song file uploaded by a user, a song file stored locally by a user (e.g., a song file stored by client computing platform 104), a song file stored remotely from client computing platform 104 and accessible by a user via client computing platform 104, and/or other song files accessible within system 100.

The instrument management module 116 may be configured to receive instrument selections. An instrument selection may indicate an instrument from an instrument inventory associated with an avatar. Such an instrument inventory may be managed by inventory module 112. An instrument selection may be received responsive to a request, invitation, and/or other prompt to select a song.

In some implementations, space module 108 may be configured to provide a representation in the virtual space of an avatar playing a track of a selected song using a selected instrument. The track being played by the avatar may correspond to a component of the selected song associated with the selected instrument. For example, where the selected instrument is a guitar, the track may be the guitar part of the selected song. The representation may include a visual presentation and/or an audio signal. The visual presentation may depict the avatar playing the selected song using the selected instrument. The audio signal may include information associated with the track of the selected song being played by the avatar.

The interaction module 118 may be configured to manage one or more interactions between avatars in the virtual space. In some implementations, an interaction region may be associated a first avatar playing a song. When a second avatar breaches or is otherwise positioned within the interaction region of the first interaction, the second avatar may interact with the first avatar. Such an interaction may include hearing the first avatar playing a song, playing along with the first avatar, and/or other interactions. Managing an interaction between avatars may include providing a request, invitation, and/or other prompt to join a given avatar in playing a song. Generally speaking, a prompt may be provided by a visual indication, an audible indication, and/or a textual indication. The interaction region associated with a given avatar may by an area or volume surrounding that avatar. According to some implementations, the interaction region of a given avatar may include an area shaped as a circle, square, oval, rectangle, and/or other shape that is approximately centered at the position of the avatar.

In some implementations, space module 108 may be configured to provide a representation in the virtual space of a first avatar playing a first track of a selected song using a first instrument and a second avatar playing a first track of the selected song. The track being played by the first avatar may correspond to a component of the selected song associated with the first instrument, while the track being played by the second avatar may correspond to a component of the selected song associated with the second instrument. For example, where the first avatar selected a guitar and the second avatar selected drums, space module 108 may provide a representation of the first avatar playing the guitar part of the selected song and the second avatar playing the drums part of the selected song. According to some implementations, the track played by the first and second avatars may be automatically synchronized. This may be extended to a plurality of avatars playing the selected song using their respective instruments. The total number of avatars and/or the total number of a specific instrument being played may be limited to some finite quantity to promote a desired musical experience.

The song ownership module 120 may be configured to designate a song owner and/or one or more song participants with respect to a given song being played. A song owner may be an avatar that selected the song being played, while a song participant may be an avatar that joined in playing the song after the song owner had begun to play. The song owner may be designated responsive to a song selection being received by song management module 114. A song participant may be designated responsive to an avatar selecting an instrument in order to participate with the song owner.

The song owner of a song may be enabled to stop playback of the song. A song participant may be unable to stop playback of the song. The song may loop indefinitely until it is stopped by the song owner. According to some implementations, when a song owner stops playing a song, that song owner has released control of what song will be played next. At such a point, the original song owner and/or another avatar may select the next song. In instances where there are multiple song owners that encounter each other's interactive regions, the song owner that has been playing for the longest amount of time may seize control of the song being played so that both avatars are playing the same song.

The soloing module 122 may be configured to receive input from a user associated with an avatar. The input may convey musical solo information. The first musical solo information may be added to an audio signal provided by space module 108. By way of non-limiting example, a guitar solo may be added to a song being played in conjunction with soloing module 122. In some implementations, musical solo information may be associated with one or more of a plurality of avatars playing a given song. Input may be provided by users via client computing platforms 104.

The stereo panning module 124 may be configured to determine stereophonic information based on a rotation and a position of a given avatar relative to a position of one or more other avatars that are playing a song within the same interaction region. Such stereophonic information may be included in an audio signal provided by space module 108. For example, the volume of an audio signal provided to a user associated with a first avatar may increase as the first avatar approaches a second avatar playing a song. As another example, if the second avatar is playing on the right side of the first avatar, the right channel of the audio signal provided to the user associated with the first avatar may be louder than the left channel. Where there are many avatars playing proximate to the first avatar, the audio signal provided to the user associated with the first avatar may be mixed according to the orientation and position of the first avatar relative to the other avatars.

In some implementations, there may be a limit to the tracks that can be heard by a given user. In such implementations, space module 108 may be configured to execute a sorting logic to determine which tracks are heard by a given user when there are more avatars playing a given song than the allowable number of tracks that can be heard. The instruments available to the avatars may be classified according to the role they have in a song. Examples of instrument classifications may include one or more of rhythm instruments, percussion instruments, lead instruments, melody instruments, and/or other instrument classifications. While an avatar may select any instrument available to them, the maximum number of instruments per classification that can be heard by a given user may be predetermined and/or limited in order to provide a desired balance in the playback of a song. According to some implementations, the instrument(s) heard by a given user may include the instrument being played by the avatar associated with the given user and, if there are other avatars playing along, the instruments being played by those other avatars up to the predetermined maximum number of instruments. Avatars playing instruments close to the given avatar may be heard preferentially over avatars playing instruments further from the given avatar. When two collocated avatars are playing the same instrument, only one of them may be heard by users associated with other nearby avatars.

In some implementations, the server 102, client computing platforms 104, and/or external resources 126 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which server 102, client computing platforms 104, and/or external resources 126 may be operatively linked via some other communication media.

A given client computing platform 104 may include one or more processors configured to execute computer program modules. For example, in some implementations, one or more processors of a given client computing platform 104 may be configured to execute one or more of user module 106, space module 108, relationship module 110, inventory module 112, song management module 114, instrument management module 116, interaction module 118, song ownership module 120, soloing module 122, stereo panning module 124, and/or other modules. The computer program modules may be configured to enable an expert or user associated with the given client computing platform 104 to interface with system 100 and/or external resources 126, and/or provide other functionality attributed herein to client computing platforms 104. By way of non-limiting example, the given client computing platform 104 may include one or more of a desktop computer, a laptop computer, a handheld computer, a NetBook, a Smartphone, a gaming console, and/or other computing platforms.

The external resources 126 may include sources of information, hosts and/or providers of virtual environments outside of system 100, external entities participating with system 100, and/or other resources. In some implementations, some or all of the functionality attributed herein to external resources 126 may be provided by resources included in system 100.

The server 102 may include electronic storage 128, one or more processors 130, and/or other components. The server 102 may include communication lines, or ports to enable the exchange of information with a network and/or other computing platforms. Illustration of server 102 in FIG. 1 is not intended to be limiting. The server 102 may include a plurality of hardware, software, and/or firmware components operating together to provide the functionality attributed herein to server 102. For example, server 102 may be implemented by a cloud of computing platforms operating together as server 102.

Electronic storage 128 may comprise electronic storage media that electronically stores information. The electronic storage media of electronic storage 128 may include one or both of system storage that is provided integrally (i.e., substantially non-removable) with server 102 and/or removable storage that is removably connectable to server 102 via, for example, a port (e.g., a USB port, a firewire port, etc.) or a drive (e.g., a disk drive, etc.). Electronic storage 128 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. The electronic storage 128 may include one or more virtual storage resources (e.g., cloud storage, a virtual private network, and/or other virtual storage resources). Electronic storage 128 may store software algorithms, information determined by processor 130, information received from server 102, information received from client computing platforms 104, and/or other information that enables server 102 to function as described herein.

Processor(s) 130 is configured to provide information processing capabilities in server 102. As such, processor 130 may include one or more of a digital processor, an analog processor, a digital circuit designed to process information, an analog circuit designed to process information, a state machine, and/or other mechanisms for electronically processing information. Although processor 130 is shown in FIG. 1 as a single entity, this is for illustrative purposes only. In some implementations, processor 130 may include a plurality of processing units. These processing units may be physically located within the same device, or processor 130 may represent processing functionality of a plurality of devices operating in coordination. The processor 130 may be configured to execute modules 106, 108, 110, 112, 114, 116, 118, 120, 122, 124, and/or other modules. Processor 130 may be configured to execute modules 106, 108, 110, 112, 114, 116, 118, 120, 122, 124, and/or other modules by software; hardware; firmware; some combination of software, hardware, and/or firmware; and/or other mechanisms for configuring processing capabilities on processor 130.

It should be appreciated that although modules 106, 108, 110, 112, 114, 116, 118, 120, 122, and 124 are illustrated in FIG. 1 as being co-located within a single processing unit, in implementations in which processor 130 includes multiple processing units, one or more of modules 106, 108, 110, 112, 114, 116, 118, 120, 122, and/or 124 may be located remotely from the other modules. The description of the functionality provided by the different modules 106, 108, 110, 112, 114, 116, 118, 120, 122, and/or 124 described below is for illustrative purposes, and is not intended to be limiting, as any of modules 106, 108, 110, 112, 114, 116, 118, 120, 122, and/or 124 may provide more or less functionality than is described. For example, one or more of modules 106, 108, 110, 112, 114, 116, 118, 120, 122, and/or 124 may be eliminated, and some or all of its functionality may be provided by other ones of modules 106, 108, 110, 112, 114, 116, 118, 120, 122, and/or 124. As another example, processor 130 may be configured to execute one or more additional modules that may perform some or all of the functionality attributed below to one of modules 106, 108, 110, 112, 114, 116, 118, 120, 122, and/or 124.

Figure 2:
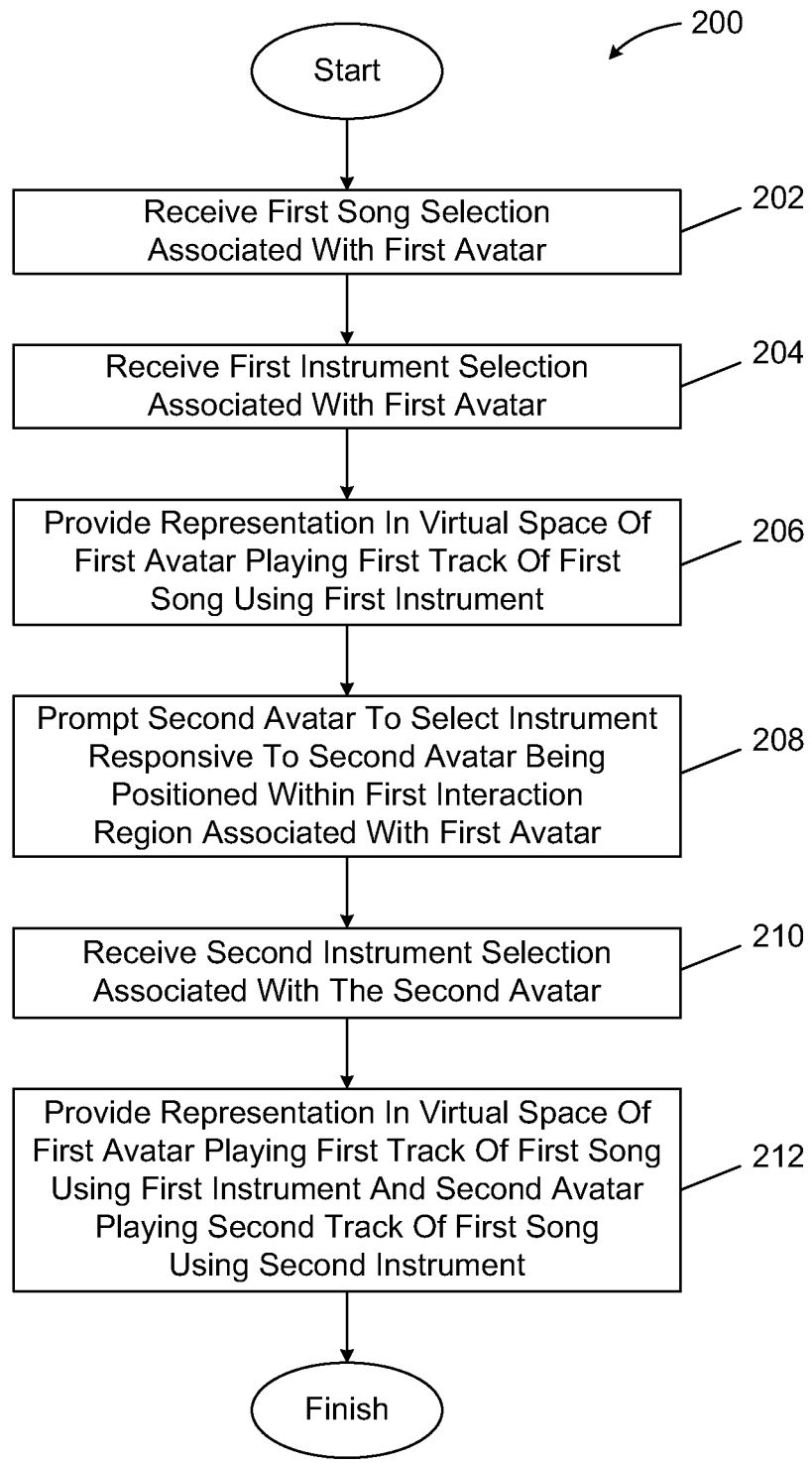
FIG. 2 illustrates a method for facilitating collaborative musical performance and/or composition in a virtual space, in accordance with one or more implementations.

FIG. 2 illustrates a method 200 for facilitating collaborative musical performance and/or composition in a virtual space, in accordance with one or more implementations. The operations of method 200 presented below are intended to be illustrative. In some implementations, method 200 may be accomplished with one or more additional operations not described, and/or without one or more of the operations discussed. Additionally, the order in which the operations of method xx are illustrated in FIG. 2 and described below is not intended to be limiting.

In some implementations, method 200 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 200 in response to instructions stored electronically on an electronic storage medium. The one or more processing devices may include one or more devices configured through hardware, firmware, and/or software to be specifically designed for execution of one or more of the operations of method 200.

At an operation 202, a first song selection associated with a first avatar may be received. The first song selection may indicate a first song from a first song inventory associated with the first avatar. The first song inventory may be managed by inventory module 112. The operation 202 may be performed by song management module 114, in some implementations.

At an operation 204, a first instrument selection associated with the first avatar may be received. The first instrument selection may indicate a first instrument from a first instrument inventory associated with the first avatar. The first instrument inventory may be managed by inventory module 112. The operation 204 may be performed by instrument management module 116, in some implementations.

At an operation 206, a representation in the virtual space may be provided of the first avatar playing a first track of the first song using the first instrument. The first track may correspond to a component of the first song associated with the first instrument. The operation 206 may be performed by space module 108, in some implementations.

At an operation 208, a second avatar may be prompted to select an instrument responsive to the second avatar being positioned within a first interaction region associated with the first avatar. The operation 208 may be performed by interaction module 118, in some implementations.

At an operation 210, a second instrument selection associated with the second avatar may be received. The second instrument selection may indicate a second instrument from a second instrument inventory associated with the second avatar. The second instrument inventory may be managed by inventory module 112. The operation 210 may be performed by instrument management module 116, in some implementations.

At an operation 212, a representation in the virtual space may be provided of the first avatar playing a first track of the first song using the first instrument and the second avatar playing a second track of the first song using the second instrument. The second track may correspond to a component of the first song associated with the second instrument. The operation 212 may be performed by space module 108, in some implementations.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A computer-implemented method for facilitating collaborative musical performance and/or composition in a virtual space, the method being implemented in a computer system including one or more physical processors and storage media storing machine-readable instructions, the method comprising:

receiving, using one or more physical processors, a first song selection associated with a first avatar, the first song selection indicating a first song from a first song inventory associated with the first avatar, the first avatar being among a plurality of avatars presented in a virtual space;

receiving, using one or more physical processors, a first instrument selection associated with the first avatar, the first instrument selection indicating a first instrument from a first instrument inventory associated with the first avatar;

providing, using one or more physical processors, a representation in the virtual space of the first avatar playing a first track of the first song using the first instrument, the first track being based on input provided by a first user and corresponding to a first component of the first song associated with the first instrument;

prompting, using one or more physical processors, a second avatar to select an instrument to play along with the first avatar responsive to the second avatar being positioned within a first interaction region associated with the first avatar, the second avatar being among the plurality of avatars presented in the virtual space;

receiving, using one or more physical processors, a second instrument selection associated with the second avatar, the second instrument selection indicating a second instrument from a second instrument inventory associated with the second avatar; and providing, using one or more physical processors, a representation in the virtual space of the first avatar playing a first track of the first song using the first instrument and the second avatar playing a second track of the first song using the second instrument, the second track being based on input provided by a second user and corresponding to a component of the first song associated with the second instrument;

wherein the first track being played by the first avatar is automatically synchronized with the second track being played by the second avatar such that synchronization of the first and the second tracks of the first song is independent from musical talents of the first user and the second user, and wherein there is a limit to the tracks that can be heard by a given user such that a given track is heard by the given user over one or more other tracks when there are more avatars playing a given song than the number of tracks for that given song.

2. The method of claim 1, wherein the first avatar is designated as a song owner with respect to the first song responsive to the first song selection being received, the song owner of the first song being enabled to stop playback of the first song.

3. The method of claim 1, wherein the second avatar is designated as a song participant with respect to the first song responsive to receiving the second instrument selection, the song participant of the first song being unable to stop playback of the first song.

4. The method of claim 1, wherein the first interaction region is an area surrounding the first avatar.

5. The method of claim 4, wherein the area surrounding the first avatar is one of a circle, a square, an oval, or a rectangle approximately centered at the first avatar.

6. The method of claim 1, further comprising providing a first audio signal for presentation to a first user associated with the first avatar, the first audio signal including information associated with each track of the first song being played by individual ones of the plurality of avatars that are within the first interaction region.

7. The method of claim 6, further comprising receiving first input from the first user associated with the first avatar, the first input conveying first musical solo information, the first musical solo information being added to the first audio signal.

8. The method of claim 6, wherein the first audio signal includes stereophonic information based on a rotation and a position of the first avatar relative to a position of other ones of the plurality of avatars that are playing a track of the first song within the first interaction region.

9. The method of claim 1, further comprising providing a second audio signal for presentation to a second user associated with the second avatar responsive to the second avatar entering the first interaction region, the second audio signal including information associated with each track of the first song being played by individual ones of the plurality of avatars that are within the first interaction region.

10. The method of claim 9, further comprising receiving first input from a first user associated with the first avatar, the first input conveying first musical solo information, the first musical solo information being added to the second audio signal.

11. The method of claim 9, wherein the second audio signal includes stereophonic information based on a rotation and a position of the second avatar relative to a position of other ones of the plurality of avatars that are playing a track of the first song within the first interaction region.

12. The method of claim 1, wherein the first interaction region and the first avatar are positioned at different locations within the virtual space.

13. The method of claim 12, wherein the first interaction region is a two-dimensional area on a surface within the virtual space.

14. The method of claim 12, wherein the first interaction region is a three-dimensional volume within the virtual space.

15. The method of claim 1, wherein the instruments available to a given avatar are classified according to a role they have in a given song, instrument classifications including one or more of rhythm instruments, percussion instruments, lead instruments, or melody instruments.

16. The method of claim 15, wherein responsive to a given avatar selecting an instrument available to them, a determination is made as to whether a maximum number of instruments per classification have been selected, such that one or more instruments heard by a given user include the selected instrument being played by the given avatar associated with the given user and other instruments being played by one or more other avatars up to the predetermined maximum number of instruments.

17. The method of claim 16, wherein one or more other avatars playing instruments close to the given avatar in a given first interaction region are heard preferentially over other ones of the one or more avatars playing instruments further from the given avatar in the given interaction region.

18. A system configured to facilitate collaborative musical performance and/or composition in a virtual space, the system comprising:
one or more physical processors configured by machine-readable instructions to:
provide a representation of the virtual space;
receive a first song selection associated with a first avatar, the first song selection indicating a first song from a first song inventory associated with the first avatar, the first avatar being among a plurality of avatars presented in a virtual space;
receive a first instrument selection associated with the first avatar, the first instrument selection indicating a first instrument from a first instrument inventory associated with the first avatar;
provide a representation in the virtual space of the first avatar playing a first track of the first song using the first instrument, the first track being based on input provided by a first user and corresponding to a component of the first song associated with the first instrument;
prompt a second avatar to select an instrument to play along with the first avatar responsive to the second avatar being positioned within a first interaction region associated with the first avatar, the second avatar being among the plurality of avatars presented in the virtual space;
receive a second instrument selection associated with the second avatar, the second instrument selection indicating a second instrument from a second instrument inventory associated with the second avatar; and
provide a representation in the virtual space of the first avatar playing a first track of the first song using the first instrument and the second avatar playing a second track of the first song using the second instrument, the second track being based on input provided by a second user and corresponding to a component of the first song associated with the second instrument;
wherein the first track being played by the first avatar is automatically synchronized with the second track being played by the second avatar such that synchronization of the first and the second tracks of the first song is independent from musical talents of the first user and the second user, and wherein there is a limit to the tracks that can be heard by a given user such that a given track is heard by the given user over one or more other tracks when there are more avatars playing a given song than the number of tracks for that given song.

19. The system of claim 18, wherein the one or more physical processors are further configured by machine-readable instructions to:

designate the first avatar as a song owner with respect to the first song responsive to the first song selection being received, the song owner of the first song being enabled to stop playback of the first song.

20. The system of claim 18, wherein the one or more physical processors are further configured by machine-readable instructions to:

designate the second avatar as a song participant with respect to the first song responsive to receiving the second instrument selection, the song participant of the first song being unable to stop playback of the first song.

21. The system of claim 18, wherein the one or more physical processors are further configured by machine-readable instructions to:

provide a first audio signal for presentation to a first user associated with the first avatar, the first audio signal including information associated with each track of the first song being played by individual ones of the plurality of avatars that are within the first interaction region.

22. The system of claim 21, wherein the one or more physical processors are further configured by machine-readable instructions to:

receive first input from the first user associated with the first avatar, the first input conveying first musical solo information, the first musical solo information being added to the first audio signal.

23. The system of claim 21, wherein the one or more physical processors are further configured by machine-readable instructions to:

determine stereophonic information based on a rotation and a position of the first avatar relative to a position of other ones of the plurality of avatars that are playing a track of the first song within the first interaction region, wherein the first audio signal includes the stereophonic information.

24. The system of claim 18, wherein the one or more physical processors are further configured by machine-readable instructions to:

provide a second audio signal for presentation to a second user associated with the second avatar responsive to the second avatar entering the first interaction region, the second audio signal including information associated with each track of the first song being played by individual ones of the plurality of avatars that are within the first interaction region.

25. The system of claim 24, wherein the one or more physical processors are further configured by machine-readable instructions to:

receive first input from a first user associated with the first avatar, the first input conveying first musical solo information, the first musical solo information being added to the second audio signal.

26. The system of claim 24, wherein the one or more physical processors are further configured by machine-readable instructions to:

determine stereophonic information based on a rotation and a position of the second avatar relative to a position of other ones of the plurality of avatars that are playing a track of the first song within the first interaction region, wherein the second audio signal includes the stereophonic information.

27. The system of claim 24, wherein the first interaction region and the first avatar are positioned at different locations within the virtual space.

28. The system of claim 27, wherein the first interaction region is a two-dimensional area on a surface within the virtual space.

29. The system of claim 27, wherein the first interaction region is a three-dimensional volume within the virtual space.

30. The system of claim 18, wherein the one or more physical processors are further configured by machine-readable instructions such that instruments available to a given avatar are classified according to a role they have in a given song, instrument classifications including one or more of rhythm instruments, percussion instruments, lead instruments, or melody instruments.

31. The system of claim 30, wherein the one or more physical processors are further configured by machine-readable instructions such that:

responsive to a given avatar selecting an instrument available to them, a determination is made as to whether a maximum number of instruments per classification have been selected, such that one or more instruments heard by a given user include the selected instrument being played by the given avatar associated with the given user and other instruments being played by one or more other avatars up to the predetermined maximum number of instruments.

32. The system of claim 31, wherein the one or more physical processors are further configured by machine-readable instructions such that one or more other avatars playing instruments close to the given avatar in a given interaction region are heard preferentially over other ones of the one or more avatars playing instruments further from the given avatar in the given interaction region.

33. A non-transitory computer-readable storage medium having instructions embodied therein, the instructions being executable by a physical processor to perform a method for facilitating collaborative musical performance and/or composition in a virtual space, the method comprising:

receiving a first song selection associated with a first avatar, the first song selection indicating a first song from a first song inventory associated with the first avatar, the first avatar being among a plurality of avatars presented in a virtual space;

receiving a first instrument selection associated with the first avatar, the first instrument selection indicating a first instrument from a first instrument inventory associated with the first avatar;

providing a representation in the virtual space of the first avatar playing a first track of the first song using the first instrument, the first track being based on input provided by a first user and corresponding to a component of the first song associated with the first instrument;

prompting a second avatar to select an instrument to play along with the first avatar responsive to the second avatar being positioned within a first interaction region associated with the first avatar, the second avatar being among the plurality of avatars presented in the virtual space;

receiving a second instrument selection associated with the second avatar, the second instrument selection indicating a second instrument from a second instrument inventory associated with the second avatar; and providing a representation in the virtual space of the first avatar playing a first track of the first song using the first instrument and the second avatar playing a second track of the first song using the second instrument, the second track being based on input provided by a second user and corresponding to a component of the first song associated with the second instrument;

wherein the first track being played by the first avatar is automatically synchronized with the second track being played by the second avatar such that synchronization of the first and the second tracks of the first song is independent from musical talents of the first user and the second user, and wherein there is a limit to the tracks that can be heard by a given user such that a given track is heard by the given user over one or more other tracks when there are more avatars playing a given song than the number of tracks for that given song.

* * * * *